United States Patent
Ohba et al.

(10) Patent No.: US 9,550,202 B2
(45) Date of Patent: Jan. 24, 2017

(54) SUBSTRATE TRANSPORT ROLLER

(71) Applicant: Kobe Steel, Ltd., Kobe-shi (JP)

(72) Inventors: Naoki Ohba, Takasago (JP); Hiroshi Tamagaki, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 14 days.

(21) Appl. No.: 14/432,601

(22) PCT Filed: Nov. 25, 2013

(86) PCT No.: PCT/JP2013/006903
§ 371 (c)(1),
(2) Date: Mar. 31, 2015

(87) PCT Pub. No.: WO2014/097545
PCT Pub. Date: Jun. 26, 2014

(65) Prior Publication Data
US 2015/0238995 A1    Aug. 27, 2015

(30) Foreign Application Priority Data

Dec. 21, 2012  (JP) .................................. 2012-279533

(51) Int. Cl.
*B05C 1/00* (2006.01)
*B05C 1/10* (2006.01)
(Continued)

(52) U.S. Cl.
CPC ................. *B05C 1/003* (2013.01); *B05C 1/10* (2013.01); *B05C 1/12* (2013.01); *C23C 14/541* (2013.01);
(Continued)

(58) Field of Classification Search
None
See application file for complete search history.

(56) References Cited

U.S. PATENT DOCUMENTS

| 3,829,373 A | 8/1974 | Kuehnle |
| 2006/0192964 A1 | 8/2006 | Lotz et al. |

(Continued)

FOREIGN PATENT DOCUMENTS

| CN | 101946021 A | 1/2011 |
| CN | 102725436 A | 10/2012 |

(Continued)

OTHER PUBLICATIONS

International Search Report and Written Opinion issued Feb. 25, 2014 in PCT/JP2013/006903 filed Nov. 25, 2013.

*Primary Examiner* — Binu Thomas
(74) *Attorney, Agent, or Firm* — Oblon, McClelland, Maier & Neustadt, L.L.P.

(57) ABSTRACT

Provided is a substrate transport roller (2a) capable of ensuring a broad temperature-control region on a substrate, without reducing substrate transport quality. This substrate transport roller (2a) is provided in a film-forming device (1) for executing a film-forming process on the surface of a film substrate (W), transports the film substrate (W) by rotating around a center axis, and is equipped with: a center-section segment (13a) positioned in the center section in the axial direction extending along the center axis, and having a first outer-circumferential surface; end-section segments (12a, 12b) positioned on both sides on the outside in the axial direction of the center-section segment (13a), and each having a second outer-circumferential surface which contacts the substrate (W) and has a larger diameter than that of the first outer-circumferential surface; a center-section-rising-falling-temperature-medium mechanism for changing the temperature of the center-section segment (13a); and a both-end-section-rising-falling-temperature mechanism for changing the temperature of each of the end-section seg- (Continued)

ments (12*a*, 12*b*) independently from the center-section segment (13*a*).

8 Claims, 4 Drawing Sheets

(51) Int. Cl.
*B05C 1/12* (2006.01)
*C23C 16/54* (2006.01)
*C23C 16/458* (2006.01)
*C23C 14/56* (2006.01)
*C23C 16/46* (2006.01)
*H05B 3/00* (2006.01)
*C23C 14/54* (2006.01)
*D21F 5/02* (2006.01)

(52) U.S. Cl.
CPC ............ *C23C 14/562* (2013.01); *C23C 16/46* (2013.01); *C23C 16/545* (2013.01); *H05B 3/0095* (2013.01); *D21F 5/022* (2013.01)

(56) References Cited

U.S. PATENT DOCUMENTS

| | | | | |
|---|---|---|---|---|
| 2010/0272887 | A1* | 10/2010 | Honda | ............ C23C 16/545 118/50 |
| 2011/0076421 | A1* | 3/2011 | Lee | ............ C23C 16/545 118/719 |
| 2011/0117279 | A1 | 5/2011 | Shinokawa et al. | |
| 2012/0301615 | A1* | 11/2012 | Honda | ............ C23C 16/545 118/724 |
| 2013/0330472 | A1 | 12/2013 | Honda et al. | |

FOREIGN PATENT DOCUMENTS

| | | | | |
|---|---|---|---|---|
| JP | 58-218046 | A | 12/1983 | |
| JP | 2004-143520 | A | 5/2004 | |
| JP | 2005-338047 | A | 12/2005 | |
| JP | WO 2009/060597 | A1 | 5/2009 | |
| JP | 2009-256709 | A | 11/2009 | |
| JP | 2010-242200 | A | 10/2010 | |
| JP | 2011-038162 | A * | 2/2011 | ............ C23C 16/54 |
| JP | 2011-038162 | A | 2/2011 | |
| JP | 5024972 | B2 | 6/2012 | |
| JP | WO2012/172722 | A1 | 12/2012 | |
| KR | 10-2010-0006582 | A | 1/2010 | |
| WO | WO 2012/172722 | A1 | 12/2012 | |

* cited by examiner

EXHAUST

SUBSTRATE TRANSPORT ROLLER

TECHNICAL FIELD

The present invention relates to a substrate transport roller which is a deposition roller or the like provided in a deposition device for executing a deposition treatment on a surface of a substrate.

BACKGROUND ART

In recent years, as a technique of producing display devices which display images and the like, generally used is a roll-to-roll method which produces a display device in a continuous manner by transporting a substrate in a form of film which is guided by a roller in a cylindrical shape. Development of process of deposition etc. or development of materials for the substrate, as well as development of hardware for manufacturing devices is proceeding simultaneously. Particularly, for the material for the substrate, assays of using thinner substrates from a viewpoint of weight saving, and development of materials which are resistant to broad range of processing temperature are proceeding. Lately, thin film glass (glass film) excellent in gas barrier property or in translucency which is capable of being processed in a high temperature compared to a resin, and at the same time, capable of being bent as a resin film, is being developed, and thus, realization of devices with properties and characteristics which has not been available in conventional techniques are expected.

Examples for use of the roll-to-roll method includes the sputtering device disclosed in patent document 1 (see FIG. 1). This sputtering device comprises a delivering/winding chamber and a deposition roller (coating drum). In this device, a film is rolled out from a film roll in the delivering/winding chamber, and then transported with being wound on the deposition roller. The film is subjected to a sputtering deposition, and then wound up to the roll in the delivering/winding chamber again. Around the deposition roller, plural numbers of coating chambers are provided, each chamber having a sputter source disposed thereto. A film of plural layers can be formed by running the film one cycle. Each of the chambers comprises a vacuum evacuation pump. Partition walls are each provided between coating chambers, and between each of the coating chambers and the delivering/winding chamber. These partition walls are disposed in front of the deposition roller adjacently. By being adjacent to the deposition roller (with about some mm of space), these partition walls allow each coating chamber to maintain its independence of the atmosphere from each other, and to form a film different from that formed by the adjacent chamber. For a long time, resin films having a low thermal resistance have generally been objects subjected to the continuous processing of such a roll-to-roll method. In order to protect the resin films from damage by heat, deposition rollers have been cooled in many of such cases.

However, in recent years, it is being requested to perform the operation with a raised temperature of the deposition roller, in order to obtain a good film quality. In particular, with the development of resin films with higher thermal resistance such as polyimide, or thin glass of 100 μm or less capable of being subjected to a roll-to-roll processing, it is sometimes requested that the deposition roller is resistant to high temperature, for example, of up to 300° C., in order to make the best use of these thermal resistance. In a film deposition on a metal foil, even higher temperature is sometimes required. Meanwhile, there has also been a request to cool the deposition roller down to a temperature of below 0, in order to execute the treatment on an ordinary resin film at a high speed. As thus explained, there has been an increased demand for the deposition roller to be operated in broad range of temperature.

Generally, in a deposition roller, a temperature control is conducted for the substrate to have a temperature necessary for a process of deposition treatment. This temperature control is conducted by uniformly raising and lowering the temperature of outer cylindrical surface of a roll in a cylindrical shape in which accuracy in the outer diameter or cylindricity is secured by machine processing. In such conventional deposition roller, when the temperature-control region for raising temperature and lowering temperature is broadened, the following problems of 1 to 3 arise.

1) Due to a thermal expansion, change in outer diameter of cylindrical surface of the deposition roller occurs on some mm scale. That will result in a deviation in running speed or running distance of the film which is controlled by rotation of the deposition roller.

2) The deposition roller loses the accuracy in cylindricity, resulting in problems in quality of transportation such as meandering of the film.

3) In a device such as the sputtering device of the patent document 1, which comprises plural partition walls and small spaces between these partition walls and the deposition roller, the spaces between the deposition roller and each partition wall will be changed by being influenced by the change of outer diameter of the deposition roller. As a result, the properties of partition walls vary. In the worst case, the deposition roller and a partition wall contact with each other.

CITATION LIST

Patent Document

Patent document 1: JP 2005-338047

SUMMARY OF THE INVENTION

The present invention is made in view of the problems discussed above, an object of which being providing a substrate transport roller which permits temperature of a substrate to be controlled over a broad range, without reducing a substrate transport quality.

The present invention provides a substrate transport roller which is installed rotatably around a specific center axis and transports a substrate, in a deposition device which executes a deposition treatment on a surface of the substrate. This substrate transport roller comprises: a center-section segment which is installed in the center portion in the axial direction along the center axis, having a first outer-circumferential surface; a pair of end-section segments each positioned in either the outer sides in the axial direction of the center-section segment, each comprising a second outer-circumferential surface and a third outer-circumferential surface respectively in a cylindrical shape which is concentric with the center axis, these second outer-circumferential surface and third outer-circumferential surface having a diameter larger than the diameter of the first outer-circumferential surface in order to transport the substrate by rotating in a state that the substrate is in contact with the second outer-circumferential surface and the third outer-circumferential surface, and in order to prevent the substrate from contacting the first outer-circumferential surface; a center-section temperature raising/lowering mechanism which varies the temperature of the center-section segment;

and a both-end-section temperature raising/lowering mechanism which varies the temperature of each of the end-section segments independently from the center-section segment.

DESCRIPTION OF EMBODIMENTS

Hereinbelow, the deposition device according to embodiments of the present invention will be explained with reference to the figures. In this connection, in each embodiment and figure which will be explained below, same component members in the deposition device will be assigned a same code and a same name. Therefore, a same explanation will not be repeated for a component member assigned the same code or the same name.

First Embodiment

Figure 1:
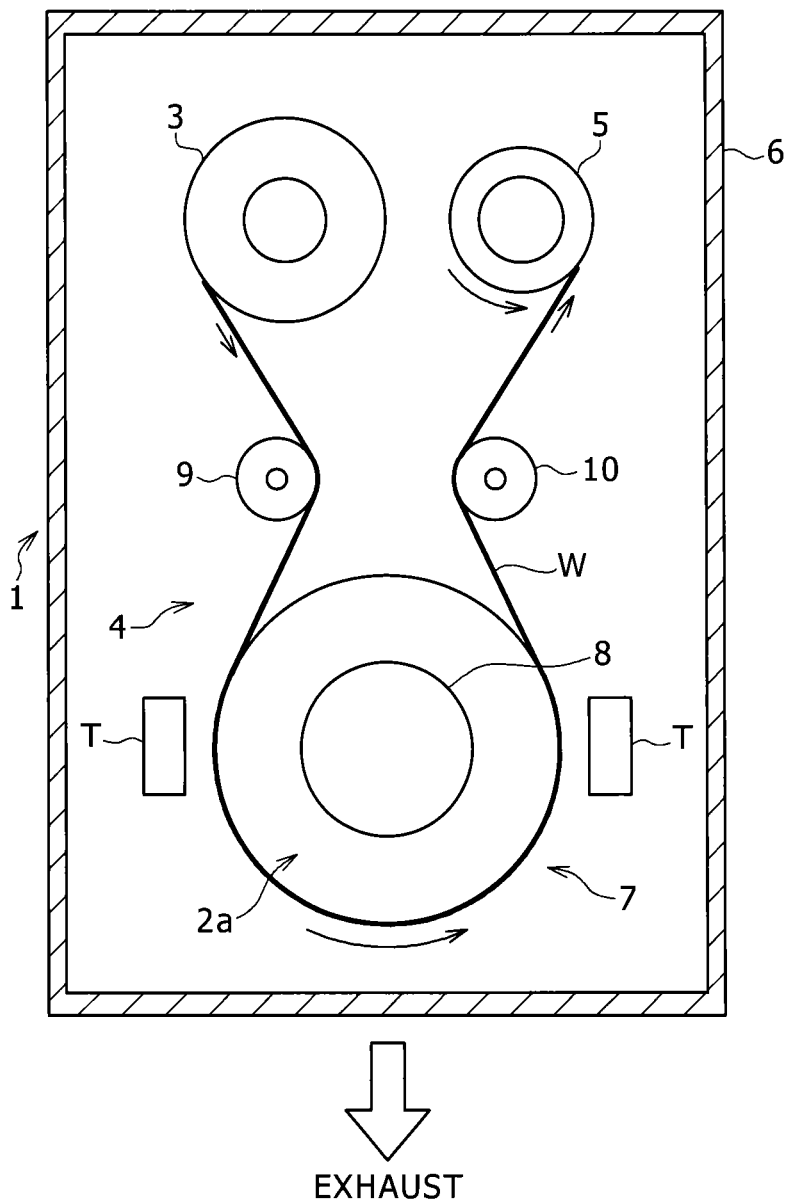
FIG. 1 is a cross-sectional front view of a deposition device according to a first embodiment of the present invention.
Figure 2:
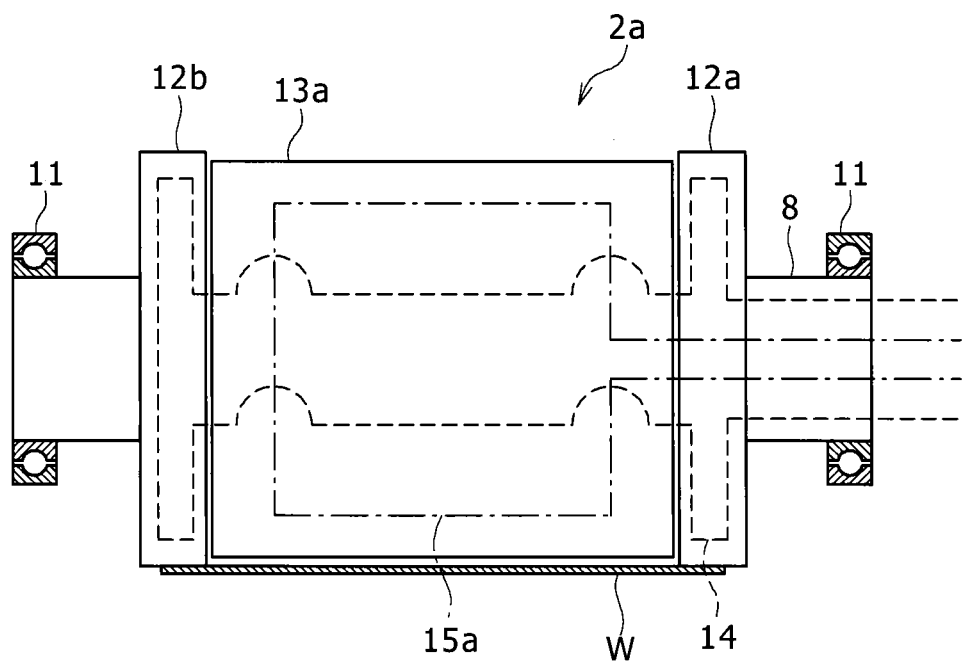
FIG. 2 is a cross-sectional side view of a deposition roller of the deposition device according to the first embodiment.

A deposition device 1 according to a first embodiment of the present invention will be explained with reference to FIG. 1 and FIG. 2. FIG. 1 is a cross-sectional front view of the deposition device 1 according to the present embodiment. FIG. 2 is a cross-sectional side view showing a deposition roller 2a which is a substrate transport roller provided to the deposition device 1.

The deposition device 1 comprises a rolling out unit 3, a film substrate transport unit 4, and a winding unit 5. The rolling out unit 3 rolls out a film substrate W which is a substrate in a form of film from a substrate roll. The substrate roll is the film substrate W wound into a rolled state. The film substrate W has, for example, a width of about 1 meter and a small thickness of about a few tens to a few hundreds μm, and comprises for example a resin or a glass. The film substrate transport unit 4 transports the rolled out film substrate W to a surface treatment process. In this surface treatment process, the film substrate W is subjected to a surface treatment by a sputtering method, CVD method, or the like. The winding unit 5 winds up the film substrate W which has been subjected to the surface treatment, again as a substrate roll in a rolled state. In short, the deposition device 1 is a device which executes a surface treatment on the film substrate W, with transporting a film substrate W having a long length, for example, of over 100 m or more from the substrate roll in the rolling out unit 3 to the substrate roll in the winding unit 5 by a so called roll-to-roll method.

Structure of the deposition device 1 according to the present embodiment will be explained with reference to FIG. 1.

In the following explanation, the up to down direction as viewed on the document of FIG. 1 corresponds to the up to down direction of the deposition device 1, and similarly, the left to right direction as viewed on the document corresponds to the left to right direction of the deposition device 1. A direction penetrating the document of FIG. 1 corresponds to the front to back direction.

This deposition device 1 is further comprises a vacuum chamber 6. The vacuum chamber 6 houses the rolling out unit 3, film substrate transport unit 4 and winding unit 5. The vacuum chamber 6 has, for example, a shape of box, formed into a state of a casing with a hollow inside. The vacuum chamber 6 further comprises a function to keep the inside airtight to outside. In the lower side of the vacuum chamber 6, a vacuum pump which is not illustrated is installed. By the vacuum pump, the inside of the vacuum chamber 6 is depressurized down to a low pressure state or a vacuum state.

The rolling out unit 3 is disposed in a left-upper side of the center portion in the up to down direction in the vacuum chamber 6 shown in FIG. 1. The rolling out unit 3 comprises a rolling out core which is a winding core. This rolling out core has, for example, a cylindrical shape or a columnar shape having a total length slightly longer than the width of the film substrate W. The substrate roll is formed by winding the film substrate W around this rolling out core. The rolling out unit 3 is formed by fixing this substrate roll to the deposition device 1. This rolling out unit 3 is disposed in the vacuum chamber 6 such that the rotation center axis provided to the rolling out unit 3 is in a direction vertical to the document of FIG. 1.

The deposition device 1 comprises a deposition unit. This deposition unit is installed in a position in the lower side of the center in the up to down direction of the vacuum chamber 6 shown in FIG. 1, in a position below the rolling out unit 3. The deposition unit executes a surface treatment (surface treatment process), for example, by a sputtering, a plasma CVD or the like, on the surface of the film substrate W rolled out from the rolling out unit 3. In the present embodiment, a sputtering deposition unit 7 using a sputtering method is disclosed as an example of the deposition unit.

The film substrate transport unit 4 comprises a substrate transport roller for transporting the film substrate W in the sputtering deposition unit 7 where the surface treatment process is executed. FIG. 1 shows a deposition roller 2a which is a part of the structure of a general sputtering deposition unit and at the same time an example of the substrate transport roller, and a pair of sputter sources T.

The deposition roller 2a of the sputtering deposition unit 7 shown in FIG. 1 is formed with a stainless material or the like into a cylindrical shape or a columnar shape. The deposition roller 2a comprises an outer-circumferential surface having a cylindrical shape, and transports a film substrate W wound therearound. The deposition roller 2a comprises a rotation axis 8 and rotates around a rotation center axis which is the center axis of this rotation axis 8. The deposition roller 2a is disposed such that the rotation center axis is substantially in parallel to the rotation center axis of the rolling out unit 3.

In the deposition roller 2a, a temperature control which appropriately raise/lower the temperature of a substrate according to conditions of a sputtering is conducted. The deposition roller 2a according to the present embodiment has a specific structure to allow the temperature control, as its characteristic. Structure in detail of the deposition roller 2a will be described later.

The sputter sources T are disposed in both the left and right side of the deposition roller 2a so as to face the film substrate W which is transported by the deposition roller 2a. The sputter sources T are sources for evaporation which comprise components to be deposited on the surface of the film substrate W. These components are sputtered (evaporated) by a glow discharge as well known, and introduced to the surface of the film substrate W and deposited on the surface.

The winding unit 5 is disposed in the right side of the rolling out unit 3 as viewed on the document of FIG. 1 in the vacuum chamber 6 shown in FIG. 1. The winding unit 5 is a unit which winds up the film substrate W which has been passed through the film substrate transport unit 4 and subjected to the surface treatment into a substrate roll again in a shape of roll. The winding unit 5 has the same structure with the rolling out unit 3, and disposed in the same manner.

The deposition device 1 further comprises a first guide roller 9 and a second guide roller 10 as shown in FIG. 1. The first guide roller 9 is installed in a position between the rolling out unit 3 and the deposition roller 2a, nearly to the deposition roller 2a. Specifically, the first guide roller 9 is disposed so as to be nearer to the center of the vacuum chamber 6, namely, nearer to the rotation axis 8 of the deposition roller 2a, than to the left end of the deposition roller 2a, in the left to right direction of the vacuum chamber 6. The first guide roller 9 is disposed rotatably around the rotation center axis provided to the first guide roller 9, and the rotation center axis is in parallel to the rotation center axes of the rolling out unit 3 and deposition roller 2a. The first guide roller 9 allows the substrate W to be transported to the deposition roller 2a constantly at a uniform angle and from a uniform direction. The second guide roller 10 is disposed between the winding unit 5 and the deposition roller 2a, to the right side of the first guide roller 9. The second guide roller 10 has the same structure with the first guide roller 9, and has an outer diameter approximately the same as the outer diameter of the first guide roller 9.

With reference to FIG. 2, hereinbelow, a structure of the deposition roller 2a will be explained in detail.

FIG. 2 is a cross-sectional side view of the deposition roller 2a, showing a structure of the deposition roller 2a viewed from the right side or the left side of the deposition device 1 shown in FIG. 1. The up to down direction as viewed on the document of FIG. 2 corresponds to the up to down direction of the deposition device 1 shown in FIG. 1. The rotation center axis of the deposition roller 2a, or the center axis of the rotation axis 8 extending in a direction vertical to (the direction penetrating) the document of FIG. 1 is shown in FIG. 2 as along the left to right direction.

The deposition roller 2a comprises a pair of bearings 11, a pair of end-section segments 12a and 12b, a center-section segment 13a, a both-end-section temperature raising/lowering mechanism, and a center-section temperature raising/lowering mechanism, in addition to the rotation axis 8. The bearings 11 are disposed in positions separated from each other in the front to back direction in the vacuum chamber 6, each holding either end portions of the rotation axis 8 rotatably at each of the positions. Namely, the rotation axis 8 is capable of rotating around the center axis with being held by the bearings 11. The both-end-section segments 12a and 12b are installed around the rotation axis 8 at positions spaced from each other in the axial direction of the rotation axis 8, and rotate with the rotation axis 8 as one body. The center-section segment 13a is installed around the rotation axis 8 in a position sandwiched between the both-end-section segments 12a and 12b. The both-end-section temperature raising/lowering mechanism comprises a both-end-section temperature raising/lowering medium path 14 which is the medium path shown by a broken line in FIG. 2. This both-end-section temperature raising/lowering medium path 14 is installed inside the end-section segments 12a and 12b. The center-section temperature raising/lowering mechanism comprises a center-section temperature raising/lowering medium path 15a which is the medium path shown by a broken line in FIG. 2. This center-section temperature raising/lowering medium path 15a is installed inside the center-section segment 13a.

The rotation axis 8 is a cylindrical or columnar member having a uniform outer diameter, with the portions near the both ends being held by the bearings 11. By such a way, the rotation axis 8 is capable of rotating around the center axis along the longitudinal direction or the axial direction thereof, namely, the rotation center axis of the deposition roller 2a. The rotation axis 8 is driven to rotate by a driving device which is not illustrated at a predetermined rotation speed.

To this rotation axis 8, the end segment 12a is installed in a position near the bearing 11 in the right side of the center in the longitudinal direction of the rotation axis 8, and the end segment 12b is installed in a position near the bearing 11 in the left side of the center in the longitudinal direction of the rotation axis 8. The both-end-section segments 12a and 12b are both in a shape of disc, and have a predetermined thickness sufficient for the sides of the end section (the side section) in the width direction of the substrate W to wind therearound. The both-end-section segments 12a and 12b each have second outer-circumferential surface and third outer-circumferential surface respectively which are concentric with the rotation center axis of the deposition roller 2a. Diameter of these second and third outer-circumferential surfaces, namely, outer diameter of the both-end-section segments 12a and 12b is optionally determined according to a desired property of the deposition device 1, which is at least larger than outer diameter of the rotation axis 8.

The both-end-section segments 12a and 12b are installed so as to be concentric with the rotation axis 8, in positions sufficiently spaced from each other. The space has a dimension sufficient for winding the both-end-sections (both side portions) in the width direction of the film substrate W around the both-end-section segments 12a and 12b, and at the same time, smaller than the width of the film substrate W. The both-end-section segments 12a and 12b are installed in positions which are substantially symmetric to each other with respect to the center position in the longitudinal direction of the rotation axis 8. The both-end-section segments 12a and 12b may be formed in one body with the rotation axis 8, and may also be formed as separate members from the rotation axis 8 and fixed to the rotation axis 8 by fixing implements. In either case, it becomes possible that the both-end-section segments 12a and 12b rotate according to the rotation of the rotation axis 8.

FIG. 2 shows a state of the film substrate W wound around the both-end-section segments 12a and 12b. In this state, the center position of the film substrate W in the width direction substantially corresponds to the center position of the rotation axis 8 in the longitudinal direction or axial direction, and the both end sections (both side sections) in the width direction of the film substrate W present on the second and the third outer-circumferential surfaces of the both-end-section segments 12a and 12b. By such a way, the film substrate W wound around the both-end-section segments 12a and 12b are transported by rotation of the both-end-section segments 12a and 12b.

The center-section segment 13a shown in FIG. 2 has a columnar or cylindrical shape having a uniform outer diameter. The length of the center-section segment 13a along the center axis or the dimension in the axial direction is smaller than the space between the both-end-section segments 12a and 12b. The center-section segment 13a has an outer diameter smaller than the outer diameters of the both-end-section segments 12a and 12b. In other words, the center-section segment 13a comprises a first outer-circumferential surface having a diameter smaller than the diameter of the second and the third outer-circumferential surfaces of the both-end-section segments 12a and 12b. The center-section segment 13a is installed with predetermined spaces inward the both-end-section segments 12a and 12b, and to be concentric with the both-end-section segments 12a and 12b and the rotation axis 8. The center-section segment 13a may be formed in one body with the rotation axis 8, and may also be formed into separate members from the rotation axis 8 and fixed to the rotation axis 8 by fixing implements. In either case, it becomes possible that the center-section segment 13a rotate according to the rotation of the rotation axis 8.

As shown in FIG. 2, the outer diameter of the center-section segment 13a or the diameter of the first outer-circumferential surface is smaller than the outer diameters of the both-end-section segments 12a and 12b or the diameter of the second and the third outer-circumferential surfaces. As a result, the inner surface of the film substrate W wound around the second and the third outer-circumferential surfaces of the both-end-section segments 12a and 12b is inhibited from contacting the first outer-circumferential surface of the center-section segment 13a, and a space (a gap) is formed between the surfaces. The diameter of the center-section segment 13a is optionally determined such that a space suitable to desired properties of the deposition device 1 is formed between the first outer-circumferential surface of the center-section segment 13a and the film substrate W.

The length of the center-section segment 13a along the axis or the length of axial direction is also optionally determined such that the space (gap) between the both-end-section segments 12a and 12b and the center-section segment 13a becomes a space suitable to desired properties of the deposition device 1. Further, it is preferred that the center-section segment 13a is installed such that the two spaces formed between the end-section segments 12a and 12b at the both ends of the center-section segment 13a becomes approximately equal to each other. By this way, the center position in the longitudinal direction of the center-section segment 13a, the middle position between the both-end-section segments 12a and 12b, and the center position of the rotation axis 8 substantially coincide with one another in the longitudinal direction or the axial direction of the rotation axis 8. As a result, the deposition roller 2a has a substantially symmetric configuration with respect to the center position in the longitudinal direction of the rotation axis 8.

As set forth above, in the deposition roller 2a in the present embodiment, the center-section segment 13a and the end-section segments 12a and 12b are separated from each other with spaces in the axial direction, and the center-section segment 13a and the end-section segments 12a and 12b which are formed in one body with the rotation axis 8 or fixed to the rotation axis 8 rotates with being synchronized with each other by rotation of the rotation axis 8.

The both-end-section temperature raising/lowering mechanism comprises the both-end-section temperature raising/lowering medium path 14 which is installed inside the end-section segments 12a and 12b as described above. In this both-end-section temperature raising/lowering medium path 14, a fluid such as a heating medium oil or water flows and circulates as a temperature raising/lowering medium. The both-end-section temperature raising/lowering medium path 14 comprises a tubular member such as pipes and the like. Alternatively, the end-section temperature raising/lowering mechanism may comprise a sheathed heater embedded in the end-section segments 12a and 12b.

As shown in FIG. 2 by a broken line, the both-end-section temperature raising/lowering medium path 14 is disposed so as to introduce the temperature raising/lowering medium from outside the deposition roller 2a to the end segment 12a in the right side, and subsequently inside the end segment 12b in the left side by way of the rotation axis 8, which is then turned in the end segment 12b to follow a reverse order of the above so as to be introduced to the outside. In other words, the both-end-section temperature raising/lowering medium path 14 comprises portions embedded inside each of both-end-segment 12a and 12b, an intermediate portion which connects these portions by way of the rotation axis 8, and a portion which connects the portion within the end-section segment 12a in the right side with a heating medium source outside the deposition roller 2a. Particularly, the portions embedded inside the end-section segments 12a and 12b are disposed along the second and the third outer-circumferential surfaces of these end-section segments 12a and 12b which are surfaces facing the substrate W.

By circulating a heated or cooled temperature raising/lowering medium in such disposed both-end-section temperature raising/lowering medium path 14 of a tubular shape, the temperature of the second and the third outer-circumferential surfaces of the end-section segments 12a and 12b, namely, the surfaces around which the film substrate W is wound is raised or lowered. By this, the temperature of the film substrate W wound around the end-section segments 12a and 12b is raised or lowered. Instead of the both-end-section temperature raising/lowering medium path 14, when, for example, a sheathed heater or the like having a shape similar to this is embedded in the end-section segments 12a and 12b, it is possible to raise the temperature of the second outer-circumferential surface of the end-section segments 12a and 12b and the temperature of the film substrate W wound around the second outer-circumferential surface by changing calorific value of the sheathed heater. In such a way, the both-end-section temperature raising/lowering mechanism allows a temperature control of the film substrate W wound around the end-section segments 12a and 12b by changing the temperature of the second and third outer-circumferential surfaces, namely, the surfaces around which the film substrate W is wound of the end-section segments 12a and 12b.

The center-section temperature raising/lowering mechanism comprises a center-section temperature raising/lowering medium path 15a installed inside the center-section segment 13a as described above. In this center-section temperature raising/lowering medium path 15a, a fluid such as a heating medium oil or water flows and circulates as a temperature raising/lowering medium. The center-section temperature raising/lowering medium path 15a comprises a tubular member such as pipes or the like. Alternatively, the center-section temperature raising/lowering mechanism may comprise a sheathed heater embedded in the center-section segment 13a.

As shown in FIG. 2 by a dashed-and-dotted line, the center-section temperature raising/lowering medium path 15a is disposed so as to introduce the temperature raising/lowering medium from outside the deposition roller 2a to inside the center-section segment 13a, which is then circulated one round in the center-section segment 13a along the first outer-circumferential surface which is a surface facing the film substrate W, and then introduced to the outside the deposition roller 2a. In other words, the center-section temperature raising/lowering medium path 15a comprises a portion embedded inside the center-section segment 13a and a portion which connects the portion with a heating medium source outside the deposition roller 2a. Particularly, the portion embedded inside the center-section segment 13a is disposed along the first outer-circumferential surface of this center-section segment 13a which is the surface facing the substrate W.

By circulating a heated or cooled temperature raising/lowering medium in such disposed center-section temperature raising/lowering medium path 15a of a tubular shape, the temperature of the first outer-circumferential surface of the center-section segment 13a, namely, the surface facing the film substrate W is raised or lowered. By this, the temperature of the film substrate W facing the first outer-circumferential surface is raised or lowered. Instead of the center-section temperature raising/lowering medium path 15a, when, for example, a sheathed heater or the like having a shape similar to this is embedded in the center-section segment 13a, it is possible to raise the temperature of the first outer-circumferential surface of the center-section segment 13a and the temperature of the film substrate W facing thereto by changing calorific value of the sheathed heater. In such a way, the center-section temperature raising/lowering mechanism allows a temperature control of the film substrate W facing the first outer-circumferential surface by changing the temperature of the first outer-circumferential surface, namely, the surface facing the film substrate W of the center-section segment 13a.

The both-end-section temperature raising/lowering mechanism which raise/lower the temperature of the both-end-section segments 12a and 12b and the center-section temperature raising/lowering mechanism which raise/lower the temperature of the center-section segment 13a are operated independently from each other. Therefore, it becomes possible that the both-end-section temperature raising/lowering mechanism and the center-section temperature raising/lowering mechanism have the both-end-sections temperature raising/lowering medium path 14 and the center-section temperature raising/lowering medium path 15a respectively, and temperature raising/lowering media having temperatures different from each other are circulated in these paths 14 and 15a; or that the both-end-section temperature raising/lowering mechanism and the center-section temperature raising/lowering mechanism each have sheathed heaters, and temperatures of these sheathed heaters are separately controlled; to thereby control temperature of the center-section segment 13a and temperature of the end-section segments 12a and 12b independently from each other.

If it is possible in this way, that the temperatures of the center-section segment 13a and of the end-section segments 12a and 12b separated from each other with spaces are controlled independently from each other, it becomes possible to control the controlling range of the temperature (temperature-control region) of the end-section segments 12a and 12b to be within a range in which no thermal expansion or thermal deformation would occur in the end-section segments 12a and 12b, while sufficiently controlling the temperature of the film substrate W to be a desired temperature by widely raising or lowering temperature of the center-section segment 13a. For example, it is possible that temperature of the center-section segment 13a is made high in order to raise temperature of the substrate W up to a temperature required by a process of sputter treatment, while temperature of the end-section segments 12a and 12b which are in contact with the film substrate W is kept low. In such a manner, it is possible to inhibit change of diameters or deterioration of cylindricity of the second and third outer-circumferential surfaces of the end-section segments 12a and 12b. As a result of this, it is possible to ensure a broad temperature-control region for a film substrate W which has not been accomplished by conventional deposition rollers, while avoiding reduction of substrate transport quality such as deterioration of speed accuracy in the transport of a film substrate W or meandering of a substrate to be transported.

Modification Example

Figure 3:
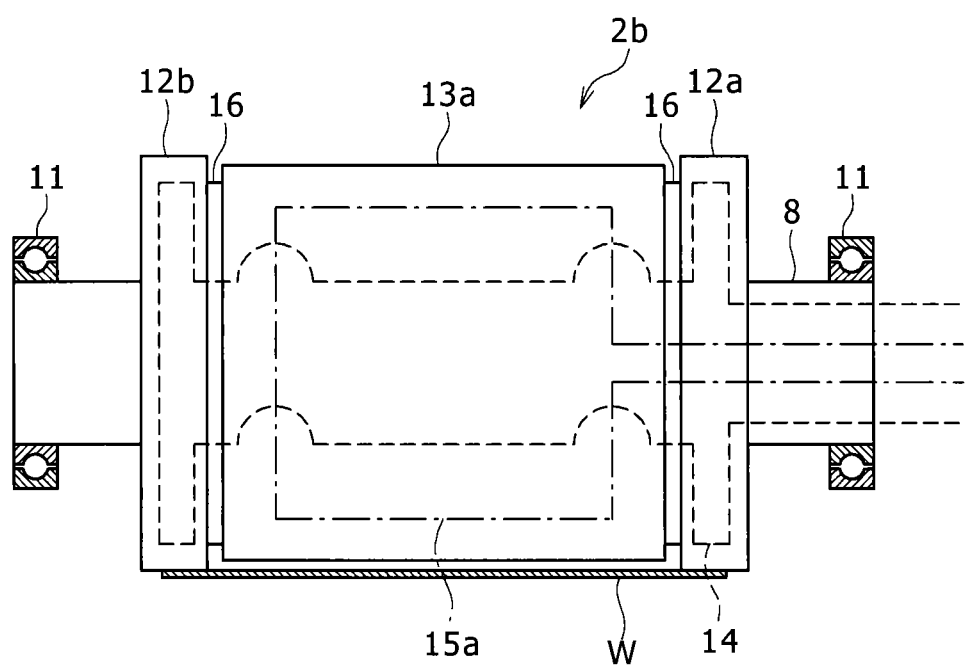
FIG. 3 is a cross-sectional side view showing an example of modification of the deposition roller according to the first embodiment.

With reference to FIG. 3, an example of modification of the first embodiment will be explained.

FIG. 3 shows a schematic structure of a deposition roller 2b of the present modification example. In addition to the component elements of the deposition roller 2a shown in FIG. 2, this deposition roller 2b further comprises a pair of temperature gradient units 16. Accordingly, the following explanation is focused on the temperature gradient units 16.

The temperature gradient units 16 comprise a heat-insulating material, and preferably comprise a heat-insulating material having a low thermal conductivity such as ceramic. Each of the temperature gradient units 16 is disposed between the center-section segment 13a and either the both-end-section segment 12a or 12b respectively. In other words, each is installed between the end-section segment 12a positioned in the right side in FIG. 3 and the center-section segment 13a, and similarly, between the end-section segment 12b positioned in the left side and the center-section segment 13a, respectively. For example, the temperature gradient units 16 substantially are in shape of disc with a thickness corresponding to the spaces formed between the center-section segment 13a and the end-section segments 12a or 12b, and installed so as to be concentric with the rotation axis 8 of the deposition roller 2b. In such a manner, the temperature gradient units 16 insulate between the center-section segment 13a and the end-section segments 12a and 12b with being in close contact with the center-section segment 13a and the end-section segments 12a and 12b, to thereby produce sufficient temperature gradient between the center-section segment 13a and the end-section segments 12a and 12b. Accordingly, the end-section segments 12a and 12b become hard to be influenced by the temperature change of the center-section segment 13a, even in a case that the temperature change of the center-section segment 13a is wide. By such a manner, according to the deposition roller 2b of the present modification example, it is possible to ensure a broader temperature-control region for the film substrate W.

The film substrate transport units of the present embodiments and of the above described modification example comprise a pressure partition wall and a gas introduction mechanism which introduces a gas into a space formed between the film substrate W and the center-section segment 13a (gas introduction space) which are not illustrated in FIGS. 1 to 3, in addition to the above described structure. The structures of the pressure partition wall and the gas introduction mechanism will be explained below, and further detailed structures will be explained in third embodiment which will be described later.

The pressure partition wall is installed in a position facing to the side not facing the substrate W of the first outer-circumferential surface of the center-section segment 13a. The pressure partition wall closes the opening between the first guide roller 9 and the second guide roller 10 shown in FIG. 1 in such a manner to cover the side not facing the film substrate W of the outer-circumferential surface of the deposition roller (the center-section segment 13a and the end-section segments 12a and 12b) 2a or 2b. The thus installed pressure partition wall makes, in cooperation with the film substrate W in contact with the end-section segments 12a and 12b, the center-section segment 13a, and the end-section segments 12a and 12b, a closed space which is a substantially sealed space comprising the gas introduction space formed between the film substrate W and the center-section segment 13a. Accordingly, when gas is introduced into the closed space by the gas introduction mechanism, pressure inside the closed space is kept sufficiently.

By including the gas introduction space in this closed space, it is possible to avoid such a problem that pressure in the gas introduction space is not sufficiently increased under a vacuum environment. In other words, it becomes possible to keep the pressure in the gas introduction space to a predetermined pressure, to thereby improve heat transfer efficiency between the film substrate W and the center-section segment 13a through the gas in the gas introduction space.

The gas introduction mechanism comprises, for example, a hollow tubular pipe. The pipe comprises plural openings formed along the longitudinal direction for pouring out a gas supplied into the hollow space of the pipe to outside of the pipe. Such a tubular gas introduction mechanism is disposed between the pressure partition wall and the center-section segment 13a, along the longitudinal direction of the deposition roller 2a or 2b. To the gas introduction mechanism, an introduction gas source is linked through a gas supply tube which is provided with a control valve such as a needle valve. This control valve varies flow rate of the gas which is supplied to the gas introduction mechanism. The gas supplied into the gas introduction space by the gas introduction mechanism is an inactive gas or the like which does not adversely affect the deposition conducted by a sputtering method.

In this manner, while using a substrate transport roller in a two-stepped configuration comprising the end-section segments 12a and 12b which are the large diameter sections on the both ends and the center-section segment 13a which is a small diameter section in the center, the substrate transport device according to the present embodiments and of the modification example are capable of supplying gas to the non-contact area of the substrate W and the substrate transport roller, namely, the area between the first outer-circumferential surface of the center-section segment 13a and the substrate W, with keeping the pressure inside the vacuum chamber to be a vacuum of an extent required by a sputtering. Therefore, it is possible to increase a level of contribution of the heat transmission which uses gas particles as a medium, in addition to that of radiant heat. As a result, it is possible to improve heat transmission efficiency to the substrate transport roller from the substrate W which has a temperature raised by incoming heat due to the deposition process.

Second Embodiment

Figure 4A:
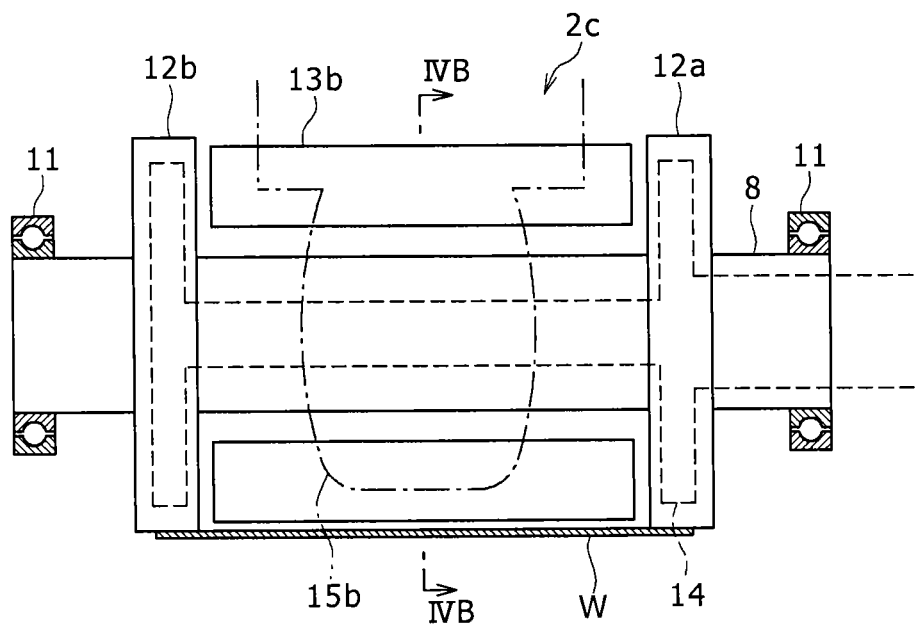
FIG. 4 (a) is a cross-sectional side view of a deposition roller of a deposition device according to a second embodiment of the present invention, and FIG. 4 (b) is a cross-sectional view along the line IVB-IVB in FIG. 4 (a).
Figure 4B:
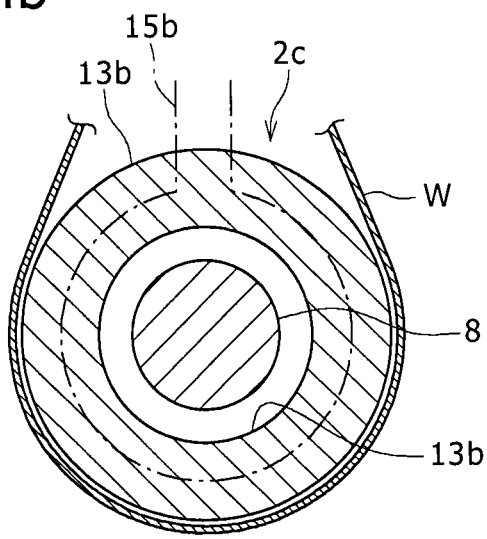

With reference to FIG. 4, the second embodiment of the present invention will be explained. FIG. 4 (a) is a cross-sectional side view of the deposition roller 2c of the deposition device 1 according to the second embodiment, which is a plan of the deposition roller 2c as viewed from the right side or the left side of the deposition device 1. FIG. 4 (b) is a cross-sectional view along the line IVB-IVB in FIG. 4 (a), which shows a cross-section of the deposition roller 2c when the deposition roller 2c is viewed along the axial direction.

The deposition roller 2c according to the present embodiment comprises a rotation axis 8, end-section segments 12a and 12b, a center-section segment 13b, an end-section temperature raising/lowering mechanism and a center-section temperature raising/lowering mechanism. Among them, the rotation axis 8, the end-section segments 12a and 12b and the end-section temperature raising/lowering mechanism are the same as those of the deposition roller 2a of the first embodiment. However, the center-section segment 13b and the center-section temperature raising/lowering mechanism differ from the center-section segment 13a and the center-section temperature raising/lowering mechanism thereof of the deposition roller 2a of the first embodiment. Hereinbelow, structures of the center-section segment 13b and the center-section temperature raising/lowering mechanism which are the differences will be explained.

As shown in FIG. 4, the center-section segment 13b has a cylindrical shape with a configuration and an outer diameter which are the same as those of the center-section segment 13a of the first embodiment. In other words, the center-section segment 13b has a cylindrical shape with the first outer-circumferential surface. Specifically, the center-section segment 13b has a cylindrical shape surrounding a through hole along a center axis in the center thereof. However, this through hole has a hole diameter larger than the outer diameter of the rotation axis 8, and the rotation axis 8 is inserted inside the center-section segment 13b so as to be concentric with, without contacting, the inner-circumferential surface of the center-section segment 13b surrounding the through hole through the entire circumference. In other words, the through hole is freely inserted in the center-section segment 13b. Thus, the center-section segment 13b is not fixed to the rotation axis 8. The center-section segment 13b is separated also from the end-section segments 12a and 12b in the axial direction with a certain spaces, and is not fixed to these end-section segments 12a and 12b as well. Accordingly, with the rotation of the rotation axis 8, the end-section segments 12a and 12b which are in contact with the film substrate W rotate with the rotation axis 8 as one body, however, the center-section segment 13b which is not in contact with the film substrate W does not rotate. Such non-rotational center-section segment 13b is fixed to the vacuum chamber 6 such that the relative position to the rotation axis 8 is not changed, for example, by providing a fixing implement on the side of the first outer-circumferential surface thereof not facing the film substrate W wound around the end-section segments 12a and 12b.

The center-section temperature raising/lowering mechanism comprises a center-section temperature raising/lowering medium path 15b installed inside the center-section segment 13b. In this center-section temperature raising/lowering medium path 15b, a fluid such as a heating medium oil or water flows and circulates as a temperature raising/lowering medium. The center-section temperature raising/lowering medium path 15b comprises a tubular member, such as pipes or the like. Alternatively, the center-section temperature raising/lowering mechanism may comprise a sheathed heater embedded in the center-section segment 13b.

As shown in FIGS. 4 (a) and (b) by a dashed-and-dotted line, the center-section temperature raising/lowering medium path 15b is disposed so as to introduce the temperature raising/lowering medium from the side of the first outer-circumferential surface not facing the film substrate W to inside the center-section segment 13b, which is then circulated one round in the center-section segment 13b along a side of the first outer-circumferential surface facing the film substrate W, and then introduced to the outside of the deposition roller 2c. Specifically, the center-section temperature raising/lowering medium path 15b comprises a portion embedded inside the center-section segment 13b and a portion which connects the embedded portion to a heating medium source outside the deposition roller 2c with traversing the first outer-circumferential surface. Particularly, the portion embedded inside the center-section segment 13b is disposed along a side facing the substrate W, of the first outer-circumferential surface of this center-section segment 13b.

That is, the center-section temperature raising/lowering medium path 15b in the present embodiment is directly introduced inside the center-section segment 13b without passing the rotation axis 8 or the end-section segments 12a and 12b as in the first embodiment, and directly introduced to the outside. By circulating a heated or cooled temperature raising/lowering medium in such disposed center-section temperature raising/lowering medium path 15b of a tubular shape, the temperature of the first outer-circumferential surface of the center-section segment 13b, namely, the surface facing the film substrate W is raised or lowered. As a result, it is possible to raise or lower the temperature of the film substrate W facing the center-section segment 13b. Instead of the center-section temperature raising/lowering medium path 15b, when a sheathed heater or the like is provided in the center-section segment 13b, it is possible to raise the temperature of a side of the first outer-circumferential surface of the center-section segment 13b facing the film substrate W and to raise the temperature of the film substrate W facing the center-section segment 13b by varying calorific value of the sheathed heater.

The center-section temperature raising/lowering medium path 15b in the present embodiment is also operated not inter-connectedly with but independently from the both-end-section temperature raising/lowering mechanism, as the center-section temperature raising/lowering medium path 15a in the first embodiment is. Therefore, it becomes possible that the both-end-section temperature raising/lowering mechanism and the center-section temperature raising/lowering mechanism have the both-end-section temperature raising/lowering medium path 14 and the center-section temperature raising/lowering medium path 15a respectively, and temperature raising/lowering media having temperatures different from each other are circulated in these paths 14 and 15b; or that the both-end-section temperature raising/lowering mechanism and the center-section temperature raising/lowering mechanism each have sheathed heaters, and temperature of the center-section segment 13b and temperature of the end-section segments 12a and 12b are controlled independently from each other by controlling temperatures of these sheathed heaters separately.

Each of the embodiments described above showed, as an example, the deposition device 1 which executes a surface treatment (deposition treatment) such as sputtering or plasma CVD, and explained the features of the deposition rollers 2a to 2c which were used in the deposition device 1. However, it is clear that the deposition rollers 2a to 2c with the structure which was explained in the present embodiments can be applied not only to the deposition device 1 but also to various devices as long as those are devices which need to have temperature of the substrate in a form of film controlled when the substrate is transported.

The deposition device 1 according to the second embodiment can also comprise the same pressure partition wall and gas introduction mechanism as those of the first embodiment. The pressure partition walls and the gas introduction mechanism allow pressure in the gas introduction space to be kept at a predetermined pressure, and allow heat transfer efficiency between the film substrate W and the center-section segment 13b improved through the gas in the gas introduction space.

Third Embodiment

Figure 5A:
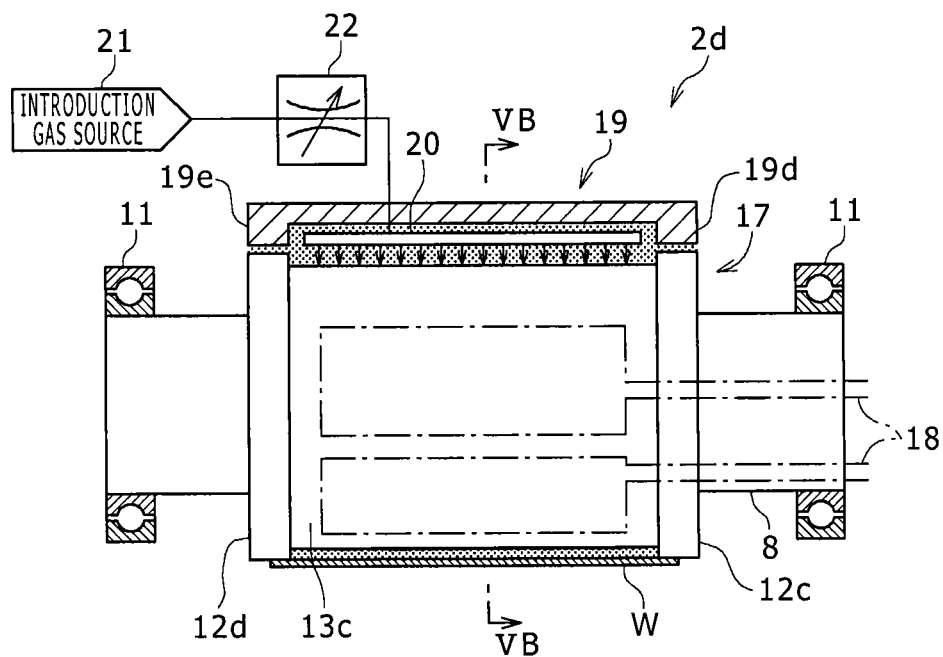
FIG. 5 (a) is a cross-sectional side view of a deposition roller of a deposition device according to a third embodiment of the present invention, and FIG. 5 (b) is a cross-sectional view along the line VB-VB in FIG. 5 (a).
Figure 5B:
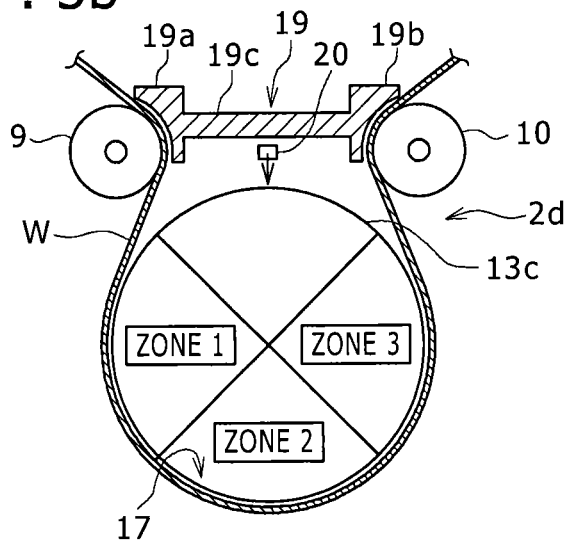

With reference to FIG. 5, the third embodiment of the present invention will be explained. FIG. 5 (a) is a cross-sectional side view of a substrate transport device 2d of the deposition device 1 according to the third embodiment, that is, a substrate transport device 2d viewed from the right side or the left side of the deposition device 1, and FIG. 5 (b) is a cross-sectional view along the line VB-VB in FIG. 5 (a).

The substrate transport device 2d comprises a deposition roller 17, a pressure partition wall 19, and a gas introduction mechanism 20. While the deposition roller 17 has a structure substantially the same as that of the deposition roller 2a of the first embodiment, it comprises a center-section segment 13c and end-section segments 12c and 12d instead of the center-section segment 13a and the both-end-section segments 12a and 12b according to the first embodiment. Insides of the end-section segments 12c and 12d are provided with both-end-section temperature raising/lowering medium paths equivalent to the both-end-section temperature raising/lowering medium path 14 according to the first embodiment, although illustration thereof is omitted. Inside of the center-section segment 13c is divided into plural zones arranged in the circumferential direction thereof. A center-section temperature raising/lowering mechanism of the deposition roller 17 comprises plural temperature raising/lowering units capable of varying temperature of each zone independently from each other. In the following explanation, structure of this center-section temperature raising/lowering mechanism will be explained in detail.

The center-section temperature raising/lowering mechanism comprises plural temperature raising/lowering medium paths 18 as the temperature raising/lowering units. In these temperature raising/lowering medium paths 18, a fluid such as a heating medium oil or water flows and circulates as a temperature raising/lowering medium. Each of the temperature raising/lowering medium paths 18a comprises a tubular member such as a pipe or the like. Alternatively, the center-section temperature raising/lowering mechanism may comprise plural sheathed heaters embedded in the center-section segment 13c.

As shown in FIG. 5 (a) by a dashed-and-dotted line, each of the temperature raising/lowering medium paths 18 is disposed so as to introduce the temperature raising/lowering media from outside the deposition roller 17 to inside the center-section segment 13c, particularly along a surface facing the substrate W of the first outer-circumferential surface of the center-section segment 13c. Inside the center-section segment 13c, three zones of ZONE 1, ZONE 2, and ZONE 3 are configured. Each of the temperature raising/lowering medium paths 18 is installed in each zone of the ZONE 1 to ZONE 3 independently from each other. Namely, the temperature raising/lowering medium paths 18 each installed in each of the zones ZONE 1 to ZONE 3 are each disposed so as to be circulated one round along the surface facing the film substrate W of the first outer-circumferential surface in each of the zones ZONE 1 to ZONE 3, and then introduced to the outside the deposition roller 17. In the deposition roller 17 in the present embodiment, although the end-section segments 12c and 12d rotate, the center-section segment 13c does not rotate. In other words, the substrate W is transported by the rotation of the end-section segments 12c and 12d, while the center-section segment 13c stays without rotating.

By circulating a heated or cooled temperature raising/lowering medium each independently in the plural tubular temperature raising/lowering medium paths 18 disposed independently from each other as described above, temperature of the surface facing the substrate W in each of the zones ZONE 1 to ZONE 3 in the center-section segment 13c is raised or lowered independently from each other. In such a manner, it is possible to raise or lower the temperature of the substrate W facing the surfaces present in each of the zones ZONE 1 to ZONE 3 in the first outer-circumferential surface of the center-section segment 13c. Number of the zones configured in the center-section segment 13c is not limited to three. In the center-section segment 13c, two zones or four or more zones may be configured. Number of the zones configured may optionally be selected according to properties desired in the substrate transport device 2d.

As described in the above, the center-section temperature raising/lowering mechanism which comprises plural temperature raising/lowering medium paths 18 is capable of raising/lowering temperature of the side facing the substrate W of the first outer-circumferential surface of the center-section segment 13c, independently for every zone, to thereby realize controlling temperature of the substrate W facing the first outer-circumferential surface of the center-section segment 13c to be temperatures each corresponding to respective deposition process of plural number of deposition processes in a single deposition roller 17.

That is, according to the substrate transport device 2d of the present embodiment, it becomes unnecessary to use plural deposition rollers for every temperature of deposition processes, and therefore, it is possible to reduce capacity of the vacuum chamber, and accordingly, it is possible to downsize the deposition device 1. Furthermore, if the thermal insulation between each zone of ZONE 1 to ZONE 3 is ensured, it is possible to control the temperatures of each zone independently and substantially accurately. On such condition, if number of the zones installed in the center-section segment 13c can be increased by subdividing the zones, plural processes can be realized on a single deposition roller 17 which allows further downsize of the deposition device.

The pressure partition wall 19 is installed in a position facing the side not facing the substrate W of the first outer-circumferential surface of the center-section segment 13c as shown in FIG. 5 (a) and FIG. 5 (b). Specifically, the pressure partition wall 19 is installed so as to cover the side not facing the film substrate W of the first outer-circumferential surface of the center-section segment 13c and the second and third outer-circumferential surfaces of the end-section segments 12c and 12d, and at the same time, to close the opening between the first guide roller 9 and the second guide roller 10 in the deposition roller 17.

The thus installed pressure partition wall 19, in cooperation with the film substrate W in contact with the second and third outer-circumferential surfaces of the end-section segments 12c and 12d, the center-section segment 13c, and the end-section segments 12c and 12d, surrounds a substantially sealed close space which is a space comprising the gas introduction space formed between the film substrate W and the center-section segment 13c, to thereby allow pressure inside the close space to be kept sufficiently, when the gas is introduced thereto by the gas introduction mechanism 20. By including a gas introduction space in the thus substantially sealed space, it becomes possible to avoid such a problem that pressure in the gas introduction space is not sufficiently increased under a vacuum environment. In other words, it becomes possible to keep the pressure in the gas introduction space to a predetermined pressure, to thereby improve heat transfer efficiency between the film substrate W and the center-section segment 13c through the gas in the gas introduction space.

As shown in FIG. 5, the pressure partition wall 19 comprises a first airtight unit 19a facing to the substrate W wound around the first guide roller 9, a second airtight unit 19b facing the substrate W wound around the second guide roller 10, a connecting unit 19c which connects the first airtight unit 19a and the second airtight unit 19b with each other, a first wall unit 19d, and a second wall unit 19e. First and second wall units 19d and 19e are installed on both sides in the left to right direction of the pressure partition wall 19 (the left to right direction in FIG. 5 (a)), with covering the side sections of the first airtight unit 19a, the second airtight unit 19b, and the connecting unit 19c. The first wall unit 19d faces the side not facing the substrate W of the second outer-circumferential surface of one of the end-section segments 12c. The second wall unit 19e faces the side not facing the substrate W of the third outer-circumferential surface of the other end segment 12d.

As shown in FIG. 5 (b), the first airtight unit 19a is a columnar member having substantially the same length with the deposition roller 17 along the longitudinal direction of the first guide roller 9, and has a curved surface which faces the first guide roller 9. This curved surface has a concaved shape corresponding to a curve of the substrate W wound around the first guide roller 9, and this curved surface is disposed in a position separated by a slight distance such as about 1 mm from the substrate W which is wound around the first guide roller 9. The second airtight unit 19b has a structure and a shape similar to those of the first airtight unit 19a, and comprises a curved surface facing the second guide roller 10. This curved surface is disposed in a position separated by a slight distance such as about 1 mm from the substrate W which is wound around the second guide roller 10.

The connecting unit 19c has a shape of flat board and substantially the same length as the length along the longitudinal direction of the first airtight unit 19a and the second airtight unit 19b. The connecting unit 19c connects the first airtight unit 19a and the second airtight unit 19b disposed as described above along the longitudinal direction of the first airtight unit 19a and the second airtight unit 19b to form one body. The connecting unit 19c closes opening between the first guide roller 9 and the second guide roller 10 so as to cover the side not facing the film substrate W of the first outer-circumferential surface of the center-section segment 13c and of the second and third outer-circumferential surfaces of the end-section segments 12c and 12d in the deposition roller 17.

As shown in FIG. 5 (b), the first airtight unit 19a, the second airtight unit 19b, and the connecting unit 19c are connected with each other to form one body, to thereby constitute a cover which covers the opening between the first guide roller 9 and the second guide roller 10. Openings are formed on one end side and the other end side of the thus integrated first airtight unit 19a, second airtight unit 19b, and connecting unit 19c. The first wall unit 19d closes the opening of the one end side, and the second wall unit 19e closes the opening of the other end side.

The first wall unit 19d has a shape of flat board with a width substantially the same as the distance between the first guide roller 9 and the second guide roller 10, and closes the opening formed between the first airtight unit 19a, second airtight unit 19b, and connecting unit 19c formed into one body and the end-section segments 12c and 12d. The first wall unit 19d has a side facing the side not in contact with the substrate W of the second outer-circumferential surface of one of the end-section segments 12c. This facing side is a curved surface which curves along the outer-circumferential surface of the end segment 12c.

The first wall unit 19d comprises a first facing side which faces the substrate W transported from the first guide roller 9 to the deposition roller 17, and a second facing side which faces the substrate W transported from the deposition roller 17 to the second guide roller 10, and these first and second facing sides extend along the direction in which the substrate W is transported. These first and second facing sides extend between the first guide roller 9, the second guide roller 10 and the deposition roller 17 along the direction in which the substrate W is transported. The first wall unit 19d is disposed in a position such that, the first and second facing sides are separated from the substrate W by a slight distance such as about 1 mm, and the curved surface facing the end segment 12c is separated from the second outer-circumferential surface of the end segment 12c by a slight distance such as about 1 mm. The second wall unit 19e has the same structure and shape with the first wall unit 19d, and installed on the other end side of the integrated first airtight unit 19a, second airtight unit 19b, and the connecting unit 19c.

The pressure partition wall 19 forms a space between the pressure partition wall 19 itself and the deposition roller 17, and the space communicates with the gas introduction space formed between the substrate W wound around the end-section segments 12c and 12d and the first outer-circumferential surface of the center-section segment 13c to thereby form an integrated space which encompasses the entire outer circumference of the center-section segment 13c of the deposition roller 17. The pressure partition wall 19 is capable of substantially isolating the space encompassing the entire outer circumference of the center-section segment 13c from the outside space thereof which is the space in the vacuum chamber 6, to thereby allow pressure in the gas introduction space to be controlled to be a pressure different from the pressure in the vacuum chamber 6 by a gas introduction mechanism 20 which will be subsequently explained.

As shown in FIGS. 5 (a) and (b), the gas introduction mechanism 20 comprises a member which comprises, for example, a tubular pipe with a hollow inside. This pipe comprises plural openings formed along the longitudinal direction for pouring out a gas supplied to the hollow space thereof outside the pipe. Such member in a shape of pipe which constitutes the gas introduction mechanism 20 is disposed between the pressure partition wall 19 and the center-section segment 13c so as to extend along the longitudinal direction of the deposition roller 17.

As shown in FIG. 5 (a), an introduction gas source 21 is connected to the gas introduction mechanism 20 through a gas supply tube. The gas supply tube is provided with a controlling valve 22. The controlling valve 22 comprises a needle valve or the like, and controls flow rate of the gas which is supplied to the gas introduction mechanism 20 from the introduction gas source 21. The gas supplied through the gas introduction mechanism 20 is an inactive gas or the like which does not adversely affect the deposition conducted by a sputtering method.

The gas supplied through the gas introduction mechanism 20 fills the space formed between the pressure partition wall 19 and the deposition roller 17, and flows into the gas introduction space formed between the substrate W wound around the end-section segments 12c and 12d and the center-section segment 13c. In such a manner, the integrated space encompassing the entire circumference of the center-section segment 13c of the deposition roller 17 is filled with the gas, and the gas introduction space filled with the gas has an increased pressure relative to the reduced pressure in the vacuum chamber 6. Due to this difference of pressure, the gas flows out from the gap of about 1 mm provided between the pressure partition wall 19 and the substrate W, and the end-section segments 12c and 12d. Pressure in the gas introduction space filled with gas is determined on the basis of a balance between the amount of gas flowed out and the amount of the gas supplied from the gas introduction mechanism 20.

In the following, the pressure in the space encompassing the outer circumference of the center-section segment 13c formed by the pressure partition wall 19 will be discussed.

For example, when a tensile force of 10 N is applied to the substrate W under a condition that a substrate W in a form of film is wound around a cylindrical deposition roller 17 of 370 mm width and 400 mm diameter over an area corresponding to 180° central angle of the deposition roller 17, a surface pressure (contact pressure) that the substrate W receives from the cylindrical surface of the deposition roll 17 is about 140 Pa. In this case, when the tensile force to the substrate W is changed, the surface pressure is changed proportionally to the tensile force. Therefore, when gas is introduced (supplied) into the gas introduction space between the substrate W and the center-section segment 13c of the deposition roller 17, if the flow rate of the supply gas from the introduction gas source 21 is controlled by the control valve 22, such that the pressure in the gas introduction space becomes less than the surface pressure that the substrate W receives from the deposition roller 17, it becomes possible to seal the gas supplied into the gas introduction space between the substrate W and the first outer-circumferential surface of the center-section segment 13c of the deposition roller 17 through the gas introduction mechanism 20, within the gas introduction space by the contact pressure of the substrate W.

Ordinary, a deposition process by a sputtering method is executed under a pressure of 0.1 Pa order. A mean free path at 0.1 Pa of an inactive gas argon (Ar) is about 7 cm. In this pressure range, the mean free path is large enough relative to the size of the gap space of the gas introduction space, which can be considered to constitute a molecular flow. A mean free path is in inverse proportion to a pressure. In a pressure region of 10 to 100 Pa, the mean free path is 0.07 to 0.7 mm which is equivalent to the size of the gap space. Accordingly, this range can be regarded as a range in transition from a molecular flow to a viscous flow. Generally, in a range of transition from molecular flow to viscous flow, gas molecules increase in number proportionally to pressure, and so increase number of collisions of gas molecules against wall surface surrounding a gas introduction space also. A heat balance resulted from a convection between walls is an energy exchange due to collisions of gas molecules in a microscopic view, which will result in a relationship such that as the number of collisions increases, amount of transmitted heat increases. Accordingly, a heat transfer coefficient is proportional to a pressure.

Meanwhile, at the time of increasing the pressure in the gas introduction space as described above, if the pressure around the gas introduction space is also increased simultaneously, a deposition process such as a sputtering is affected. Therefore, in order to ensure a pressure difference between the inside and outside the gas introduction space sufficiently, it is necessary to appropriately design a conductance (flow resistance) resulted from the gap around the pressure partition wall 19 to thereby provide an upper limit of the pressure within the gap.

For example, in FIG. 5, provided that the diameters of the first guide roller 9 and the second guide roller 10 are 74 mm, the widths of the first guide roller 9 and the second guide roller 10 are 370 mm, gap between the first guide roller 9 or the second guide roller 10 and the pressure partition wall 19 is 1 mm, holding angles (winding angle) of the substrate W at the first guide roller 9 and at the second guide roller 10 are 90°, gas outlet gap formed by the gap between the first guide roller or the second guide roller and the pressure partition wall 19 can be modeled as a rectangular slit of 1 mm opening×370 mm width and 60 mm depth (¼ of the circumferential length corresponding to 74 mm diameter). In practice, there will be influences due to curvatures of the first guide roller 9 and the second guide roller 10 or due to gaps of the side surfaces of the first guide roller 9 and the second guide roller 10, which are not taken into consideration herein.

A conductance in this case is estimated to be about 0.003 [m3/s] from the formula of the modeled rectangular slit. Provided that the pressure inside the gas introduction space is 100 Pa and the pressure outside the gas introduction space is 0 Pa, the amount of gas leakage from the pressure partition wall 19 can be estimated to be about 180 sccm.

It becomes practicable to ensure the pressure difference based on the above discussion, if a gas in an amount corresponding to this gas leakage is constantly introduced through the gas introduction mechanism 20, and a high vacuum evacuation pump having a sufficient evacuation ability such as a turbo molecular pump (TMP) is used as the pump for evacuating the vacuum chamber 6. Specifically, it becomes possible to increase the pressure inside the gas introduction space up to a pressure of about 100 to 1000 times of the processing pressure of sputtering time, and accordingly, it becomes possible to expect an increase of heat transfer coefficient corresponding to the increased pressure (in case of molecular flow, proportional to the pressure).

Thus, by use of the substrate transport device 2d according to the present embodiment, while using a substrate transport roller in a two-stepped configuration comprising the both-end-section segments 12c and 12d which are the large diameter sections on the both sides and the center-section segment 13c which is a small diameter section in the center as in the deposition roller 17, it is possible to supply gas to the non-contact area of the substrate W and the substrate transport roller, with keeping the pressure inside the vacuum chamber 6 to be a vacuum of an extent required for a sputtering. Thus, it is possible to increase a level of contribution of the heat transmission which uses gas particles in addition to radiant heat as a medium. As a result, it is possible to improve heat transmission efficiency to the deposition roller 17 from the substrate W which has a temperature raised by incoming heat due to the deposition process. In this manner, the heat penetrated into the substrate W due to the deposition process such as a sputtering can be sufficiently removed as well, to thereby prevent occurrence of crimps or creases in the substrate W transported to the substrate transport roller having the two-stepped configuration.

According to the substrate transport device explained in the first embodiment to the third embodiment described above, it is possible to control the temperature of the substrate W to be a temperature required by a deposition process by widely changing the temperature of the center-section segment 13c, while inhibiting the second and third outer-circumferential surfaces of the end-section segments 12c and 12d from changing the outer diameters thereof or from deteriorating the cylindricity thereof, by suppressing the temperature variation of the end-section segments 12c and 12d which are in contact with the substrate W to be small.

In a substrate transport device capable of suppressing the temperature variation of the end-section segments 12c and 12d to be small in such manner, a glass substrate with edge tabs, etc. can be transported as an object of the deposition process. The glass substrate with edge tabs comprises a glass substrate and a protection member fixed to the both ends thereof along the longitudinal direction which is called as edge tab. Many of the edge tabs are formed with resin or the like which is weak to heat. A glass substrate has a melting point higher than that of a film substrate made of resin. Therefore, in a case where a glass substrate is used as an object of the deposition process, it is possible to execute the deposition process at a high deposition temperature compared to a case of using a film substrate made of resin having a low thermal resistance as an object of the deposition process, and it is expected to execute a deposition making the most use of the high thermal resistance which is a material characteristic thereof. However, in a case of using a glass substrate with edge tabs which is installed with edge tabs made of resin having a low thermal resistance in the deposition process, the deposition process has to be executed at a deposition temperature of a degree that would not deform the edge tabs made of resin, and consequently, it is difficult to execute a deposition making the most use of the material characteristic of the glass substrate.

However, according to the substrate transport device explained in each embodiment described above, it is possible to heat a glass substrate having a high thermal resistance by increasing the temperature of the center-section segment to be high, with keeping the temperature of the end-section segments which is in contact with edge tabs having a low thermal resistance to be low. Therefore, it is possible to execute a deposition which makes the most use of the high thermal resistance of a glass substrate, with inhibiting deformation of edge tabs.

Incidentally, the embodiments disclosed this time should be considered to be examples in every point, and to be nonrestrictive. In particular, features not explicitly disclosed in the embodiments disclosed this time, such as operation conditions, measurement conditions, every kinds of parameters, and dimensions, weights, or volumes of structures do not deviate from the range ordinary performed by those skilled in the art, and values used therein are those easily predictable by those skilled in the art.

For example, in each embodiment described above, with showing a deposition device 1 which executes a surface treatment (deposition treatment) such as sputtering or plasma CVD, as an example, the features of the substrate transport roller which is used in this deposition device 1 is explained. However, it is clear that the substrate transport roller having the structure explained in each embodiment can be applied not only to the deposition device 1 but also to various devices as long as those are devices which need to have temperature of the substrate W in a form of film controlled when the substrate W is transported.

As in the above, the present invention provides a substrate transport roller which permits temperature of a substrate to be controlled over a broad range, without reducing quality of transportation of the substrate. This substrate transport roller comprises: a center-section segment which is installed rotatably around a specific center axis in a deposition device which executes a deposition treatment on the surface of a substrate, to transport the substrate, with being installed in the center section in the axial direction along the center axis and comprising a first outer-circumferential surface in a cylindrical shape concentric with the center axis; a pair of end-section segments each positioned in either the outer sides of the center-section segment in the axial direction, comprising a second outer-circumferential surface and a third outer-circumferential surface respectively in a cylindrical shape which are concentric with the center axis, these second outer-circumferential surface and the third outer-circumferential surface having a diameter larger than the diameter of the first outer-circumferential surface in order to transport the substrate by rotating in a condition that the substrate is in contact with the second outer-circumferential surface and the third outer-circumferential surface, and in order to prevent the substrate from contacting the first outer-circumferential surface; a center-section temperature raising/lowering mechanism which varies the temperature of the center-section segment; and a both-end-section temperature raising/lowering mechanism which varies temperature of each of the end-section segments independently from the center-section segment.

According to this substrate transport roller, it is possible to control the temperature of the center-section segment and the temperature of the end-section segments independently from each other. Accordingly, it is possible for example to control the controlling range of the temperature (temperature-control region) of the end-section segments to be a range in which no thermal expansion or thermal deformation would occur in the end-section segments, with widely raising or lowering the temperature of the center-section segment so that the temperature of the film substrate is controlled to be a desired temperature.

The center-section segment and the end-section segments may either be separated from each other or rotate with being synchronized with each other. In the case of the latter, it is possible to rotate the end-section segments to transport a substrate with keeping the center-section segment in a non-rotating state.

In the present invention, it is preferred that temperature gradient units which produce a temperature gradient are further provided between the center-section segment and the end-section segments. These temperature gradient units suppress the influence of the change of temperature of the center-section segment to the end-section segments to be small, to thereby allow the temperature of the end-section segments to be controlled with an enhanced accuracy. Preferred examples for the temperature gradient units include those comprising a heat-insulating material, and insulate the center-section segment and the end-section segments from each other by being installed therebetween.

The invention claimed is:

1. A substrate transport roller which is installed rotatably around a specific center axis and transports a substrate in a deposition device which executes a deposition treatment on a surface of the substrate, comprising:

a center-section segment which is installed in a center portion in an axial direction along the center axis, and comprises a first outer-circumferential surface;

a pair of end-section segments respectively positioned at outer sides of the center-section segment in the axial direction, each respectively comprising a second outer-circumferential surface and a third outer-circumferential surface in a cylindrical shape which are concentric with the center axis, the second outer-circumferential surface and the third outer-circumferential surface each having a diameter larger than the diameter of the first outer-circumferential surface in order to transport the substrate by rotating in a condition that the substrate is in contact with the second outer-circumferential surface and the third outer-circumferential surface, and in order to prevent the substrate from contacting the first outer-circumferential surface;

a center-section temperature raising/lowering mechanism which varies temperature of the center-section segment, including heating of the center-section segment; and a both-end-section temperature raising/lowering mechanism which varies temperature of each of the pair of end-section segments, including heating of the pair of end-section segments, independently from the center-section segment.

2. The substrate transport roller as described in claim 1, wherein the center-section segment and the pair of end-section segments are separated from each other.

3. The substrate transport roller as described in claim 1, wherein the center-section segment and the pair of end-section segments rotate while synchronized with each other.

4. A substrate transport roller which is installed rotatably around a specific center axis and transports a substrate in a deposition device which executes a deposition treatment on a surface of the substrate, comprising:

a center-section segment which is installed in a center portion in an axial direction along the center axis, and comprises a first outer-circumferential surface;

a pair of end-section segments respectively positioned at outer sides of the centersection segment in the axial direction, each respectively comprising a second outer-circumferential surface and a third outer-circumferential surface in a cylindrical shape which are concentric with the center axis, the second outer-circumferential surface and the third outer-circumferential surface each having a diameter larger than the diameter of the first outer-circumferential surface in order to transport the substrate by rotating in a condition that the substrate is in contact with the second outer-circumferential surface and the third outer-circumferential surface, and in order to prevent the substrate from contacting the first outer-circumferential surface;

a center-section temperature raising/lowering mechanism which varies temperature of the center-section segment; and a both-end-section temperature raising/lowering mechanism which varies temperature of each of the pair of end-section segments independently from the center-section segment, wherein the center-section segment is non-rotational and both-end-section segments rotate.

5. The substrate transport roller as described in claim 2 further comprising a temperature gradient unit which produces a temperature gradient between the center-section segment and the pair of end-section segments.

6. The substrate transport roller as described in claim 1, wherein the pair of end-section segments are thermally insulated from the center-section segment.

7. The substrate transport roller as described in claim 6, wherein the center-section segment and the pair of end-section segments are separated from each other.

8. The substrate transport roller as described in claim 6 further comprising a heat insulating material which produces a temperature gradient provided between the center-section segment and the pair of end-section segments.

* * * * *